(12) United States Patent
Chung et al.

(10) Patent No.: US 10,917,088 B1
(45) Date of Patent: Feb. 9, 2021

(54) POWER CONVERSION DEVICE

(71) Applicants: SUZHOU MEAN WELL TECHNOLOGY CO., LTD., Jiang-Su (CN); MEAN WELL (GUANGZHOU) ELECTRONICS CO., LTD., Guangzhou (CN)

(72) Inventors: Yu-Wei Chung, Guangzhou (CN); Ya-Jhe Liu, Guangzhou (CN)

(73) Assignees: Suzhou Mean Well Technology Co., Ltd., Jiang-Su (CN); Mean Well (Guangzhou) Electronics Co., Ltd., Guangzhou (CN)

( * ) Notice: Subject to any disclaimer, the term of this patent is extended or adjusted under 35 U.S.C. 154(b) by 0 days.

(21) Appl. No.: 16/722,549

(22) Filed: Dec. 20, 2019

(51) Int. Cl.
| | |
|---|---|
| H03K 17/687 | (2006.01) |
| H02M 1/08 | (2006.01) |
| H02M 3/06 | (2006.01) |
| H02M 3/335 | (2006.01) |
| H02M 7/217 | (2006.01) |

(52) U.S. Cl.
CPC .......... *H03K 17/6872* (2013.01); *H02M 1/08* (2013.01); *H02M 3/06* (2013.01); *H02M 3/335* (2013.01); *H02M 7/217* (2013.01)

(58) Field of Classification Search
CPC ...... H03K 17/6872; H02M 1/08; H02M 3/06; H02M 3/335; H02M 7/217; H02M 7/043; H02M 7/10; H02M 7/19; H02M 3/33507; H02M 1/14; H02M 1/44; H02M 1/12; H02M 1/32
See application file for complete search history.

(56) References Cited

U.S. PATENT DOCUMENTS

2011/0292693 A1* 12/2011 Niijima ............. H02M 3/33507
363/21.17

FOREIGN PATENT DOCUMENTS

| CN | 106026666 A | 10/2016 |
|---|---|---|
| CN | 109450261 A | 3/2019 |
| CN | 109742927 A | 5/2019 |

OTHER PUBLICATIONS

Search Report Issued by Foreign Patent Office in Application No. 201911328025.3 dated Aug. 3, 2020.

* cited by examiner

*Primary Examiner* — John W Poos
(74) *Attorney, Agent, or Firm* — Rosenberg, Klein & Lee (57) ABSTRACT

A power conversion device includes a transformer, a first electrical switch, a second electrical switch, at least one balanced capacitor, at least one voltage-stabilizing capacitor, and a power-providing circuit. The first electrical switch, the second electrical switch, the balanced capacitor, and the voltage-stabilizing capacitor are connected to the primary side of the transformer, and the secondary side of the transformer is connected to the power-providing circuit. The primary side has a first terminal, a second terminal, and a third terminal therebetween. The first electrical switch and the second electrical switch are respectively connected to a high-voltage terminal and a low-voltage terminal, and the voltage-stabilizing capacitor is connected between the two voltage terminals. One end of the balanced capacitor is connected to the third terminal, and another end of the balanced capacitor is connected to the voltage-stabilizing capacitor or the voltage terminals.

21 Claims, 5 Drawing Sheets

POWER CONVERSION DEVICE

BACKGROUND OF THE INVENTION

Field of the Invention

The present invention relates to a conversion device, particularly to a power conversion device.

Description of the Related Art

Due to the fact that internal elements of most electric devices require direct-current (DC) voltages, a power supply is used to convert alternating-current (AC) voltages or DC voltage into the DC voltages such that the electric device operate well. The power supply is divided into nonisolated power supplies and isolated switching power supplies. Isolated power supplier, with an inclusion of a power transformer, is used for most AC to DC, and some DC to DC converters, for safety and other performance considerations. There are various topologies for such converters; examples of such isolated converters topologies including Flyback, Forward, Quasi-Resonant, Full Bridge, Half-Bridge and Push-Pull.

Figure 1:
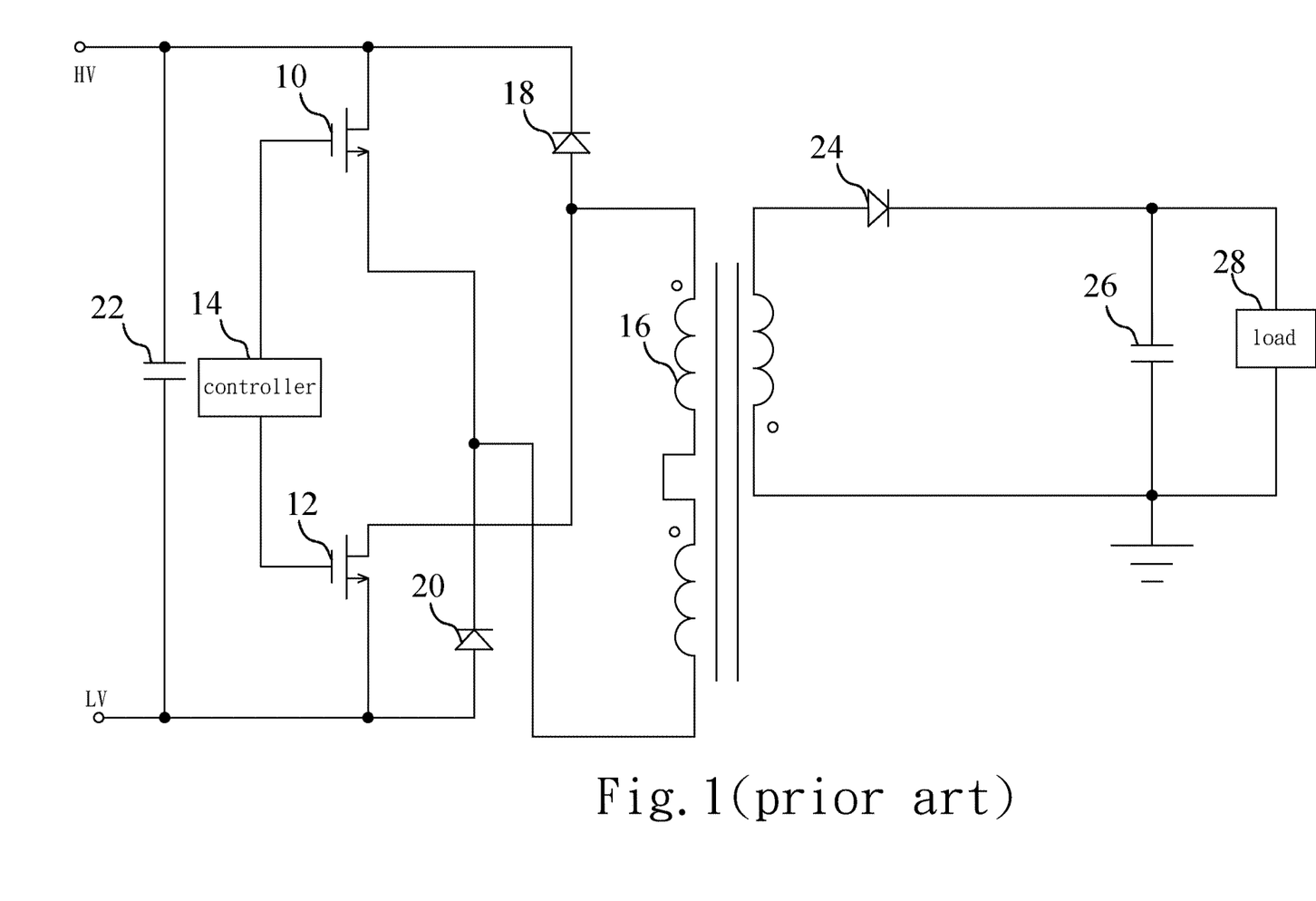
FIG. 1 is a diagram schematically illustrating a power conversion device in the conventional technology.

Take a Flyback power converter as an example. As shown in FIG. 1, the Flyback power converter includes a first electrical switch 10, a second electrical switch 12, a controller 14, a transformer 16, a first diode 18, a second diode 20, a voltage stabilizing capacitor 22, a third diode 24, a loading capacitor 26. A direct-current (DC) voltage is applied across a high-voltage terminal HV and a low-voltage terminal LV. The DC voltage stores energy into the primary side of the transformer 16 through the first electrical switch 10 and the second electrical switch 12 when the controller 14 turns on the first electrical switch 10 and the second electrical switch 12. The transformer 16 provides the stored energy for the loading capacitor 26 and a load 28 through the third diode 24. Since the DC voltage is a high voltage, the first electrical switch 10 and the second electrical switch 12 are connected in series and used to withstand the high voltage. Besides, considering the margin of withstanding voltage, the first electrical switch 10 and the second electrical switch 12 are realized with high-voltage transistors. However, the number of semiconductor manufacturers that can supply high-voltage transistors in the market is limited. The parasitic capacitance of the high-voltage transistors varies according to different conditions of the semiconductor process, resulting in different voltage drops across the first electrical switch 10 and the second electrical switch 12. Thus, the entire circuit is not stable enough.

SUMMARY OF THE INVENTION

The primary objective of the present invention is to provide a power conversion device, which designs a balanced capacitor and the primary side of a transformer to have suitable voltage drops, such that the voltage drops across a first electrical switch and a second electrical switch balance each other without changing the internal structures of the first electrical switch and the second electrical switch, thereby improving the stability of the power conversion device and the flexibility of component selection.

To achieve the abovementioned objectives, the present invention provides a power conversion device, which comprises a transformer having a primary side and a secondary side, the primary side has a first winding, a second winding, a first terminal, a second terminal, and a third terminal, the third terminal is located between the first terminal and the second terminal, the first winding is located between the first terminal and the third terminal, the second winding is located between the second terminal and the third terminal, and the first winding and the second winding store energy; a first electrical switch electrically connected between a high-voltage terminal and the second terminal; a second electrical switch electrically connected between a low-voltage terminal and the first terminal; at least one first voltage-stabilizing capacitor and at least one second voltage-stabilizing capacitor electrically connected in series and connected between the high-voltage terminal and the low-voltage terminal; a balanced capacitor with an end thereof electrically connected between the at least one first voltage-stabilizing capacitor and the at least one second voltage-stabilizing capacitor, and another end of the balanced capacitor is electrically connected to the third terminal; and a power-providing circuit electrically connected to the secondary side and a load, a direct-current (DC) voltage is applied across the high-voltage terminal and the low-voltage terminal, when the first electrical switch and the second electrical switch are turned off, the transformer uses the energy to provide an output voltage for the load through the power-providing circuit, a first total voltage drop across the secondary winding and the first electrical switch is equal to a second total voltage drop across the balanced capacitor and the at least one first voltage-stabilizing capacitor, and a third total voltage drop across the first winding and the second electrical switch is equal to a fourth total voltage drop across the balanced capacitor and the at least one second voltage-stabilizing capacitor, a sum of the first total voltage drop and the fourth total voltage drop is equal to a sum of the second total voltage drop and the third total voltage drop, a sum of the second total voltage drop and the third total voltage drop is equal to the DC voltage, and voltage drops across the at least one first voltage-stabilizing capacitor, the at least one second voltage-stabilizing capacitor, the first winding, and the second winding balance each other to balance voltage drops across the first electrical switch and the second electrical switch.

In an embodiment of the present invention, a voltage drop across the at least one first voltage-stabilizing capacitor is directly proportional to a voltage drop across the second winding and a voltage drop across the at least one second voltage-stabilizing capacitor is directly proportional to a voltage drop across the first winding.

In an embodiment of the present invention, the number of coils of the first winding is equal to the number of coils of the second winding and the capacitance of the at least one first voltage-stabilizing capacitor is equal to the capacitance of the at least one second voltage-stabilizing capacitor.

In an embodiment of the present invention, a voltage drop across the at least one first voltage-stabilizing capacitor is inversely proportional to a voltage drop across the first winding and a voltage drop across the at least one second voltage-stabilizing capacitor is inversely proportional to a voltage drop across the second winding.

In an embodiment of the present invention, the secondary side has a fourth terminal and a fifth terminal and the power-providing circuit further comprises a first diode with an anode thereof electrically connected to the fourth terminal, and the cathode of the first diode is electrically connected to the load; and a power-providing capacitor with one terminal thereof electrically connected to the load and the cathode of the first diode, another terminal of the power-providing capacitor is electrically connected to the load, a grounding terminal, and the fifth terminal, and the transformer uses the energy to provide the output voltage for the load through the first diode and the power-providing capacitor.

In an embodiment of the present invention, the power-providing circuit further comprises a second diode with an anode thereof electrically connected to the grounding terminal and the fifth terminal, and the cathode of the second diode is electrically connected to the cathode of the first diode; and an inductor with one terminal thereof electrically connected to the cathodes of the first diode and the second diode, another terminal of the inductor is electrically connected to the power-providing capacitor and the load, and the transformer uses the energy to provide the output voltage for the load through the second diode and the inductor.

In an embodiment of the present invention, the DC voltage stores the energy into the first winding and the second winding when the DC voltage is generated and the first electrical switch and the second electrical switch are turned on.

In an embodiment of the present invention, the first electrical switch and the second electrical switch are metal-oxide-semiconductor field effect transistors (MOSFET).

In an embodiment of the present invention, the power conversion device further comprises a first rectifying diode with an anode thereof electrically connected to the first terminal and the second electrical switch, the cathode of the first rectifying diode is electrically connected to the high-voltage terminal, and the first rectifying diode blocks a surge signal transmitted from the high-voltage terminal to the primary side.

In an embodiment of the present invention, the power conversion device further comprises a second rectifying diode with an anode thereof electrically connected to the second terminal and the first electrical switch, the cathode of the second rectifying diode is electrically connected to the low-voltage terminal, and the second rectifying diode blocks a surge signal transmitted from the low-voltage terminal to the primary side.

The present invention also provides a power conversion device, which comprises: a transformer having a primary side and a secondary side, the primary side has a first winding, a second winding, a first terminal, a second terminal, and a third terminal, the third terminal is located between the first terminal and the second terminal, the first winding is located between the first terminal and the third terminal, the second winding is located between the second terminal and the third terminal, and the first winding and the second winding store energy; a first electrical switch electrically connected between a high-voltage terminal and the second terminal; a second electrical switch electrically connected between a low-voltage terminal and the first terminal; a first balanced capacitor electrically connected between the third terminal and the high-voltage terminal; a second balanced capacitor electrically connected between the third terminal and the low-voltage terminal; and a power-providing circuit electrically connected to the secondary side and a load, a direct-current (DC) voltage is applied across the high-voltage terminal and the low-voltage terminal, when the first electrical switch and the second electrical switch are turned off, the transformer uses the energy to provide an output voltage for the load through the power-providing circuit, a first total voltage drop across the secondary winding and the first electrical switch is equal to a voltage drop across the first balanced capacitor, a second total voltage drop across the first winding and the second electrical switch is equal to a voltage drop across the second balanced capacitor, a third total voltage drop across the second winding, the second balanced capacitor, and the first electrical switch is equal to a fourth total voltage drop across the first winding, the first balanced capacitor, and the second electrical switch, the fourth total voltage drop is equal to a fifth total voltage drop across the first balanced capacitor and the second balanced capacitor, and voltage drops across the first balanced capacitor, the second balanced capacitor, the first winding, and the second winding balance each other to balance voltage drops across the first electrical switch and the second electrical switch.

In an embodiment of the present invention, the power conversion device further comprises at least one voltage-stabilizing capacitor electrically connected between the high-voltage terminal and the low-voltage terminal.

In an embodiment of the present invention, a voltage drop across the first balanced capacitor is directly proportional to a voltage drop across the second winding and a voltage drop across the second balanced capacitor is directly proportional to a voltage drop across the first winding.

In an embodiment of the present invention, the number of coils of the first winding is equal to the number of coils of the second winding and a capacitance of the first balanced capacitor is equal to a capacitance of the second balanced capacitor.

In an embodiment of the present invention, a voltage drop across the first balanced capacitor is inversely proportional to a voltage drop across the first winding and a voltage drop across the second balanced capacitor is inversely proportional to a voltage drop across the second winding.

In an embodiment of the present invention, the secondary side has a fourth terminal and a fifth terminal and the power-providing circuit further comprises: a first diode with an anode thereof electrically connected to the fourth terminal, and a cathode of the first diode is electrically connected to the load; and a power-providing capacitor with one terminal thereof electrically connected to the load and the cathode of the first diode, another terminal of the power-providing capacitor is electrically connected to the load, a grounding terminal, and the fifth terminal, and the transformer uses the energy to provide the output voltage for the load through the first diode and the power-providing capacitor.

In an embodiment of the present invention, the power-providing circuit further comprises: a second diode with an anode thereof electrically connected to the grounding terminal and the fifth terminal, and a cathode of the second diode is electrically connected to the cathode of the first diode; and an inductor with one terminal thereof electrically connected to the cathodes of the first diode and the second diode, another terminal of the inductor is electrically connected to the power-providing capacitor and the load, and the transformer uses the energy to provide the output voltage for the load through the second diode and the inductor.

In an embodiment of the present invention, the DC voltage stores the energy into the first winding and the second winding when the DC voltage is generated and the first electrical switch and the second electrical switch are turned on.

In an embodiment of the present invention, the first electrical switch and the second electrical switch are metal-oxide-semiconductor field effect transistors (MOSFET).

In an embodiment of the present invention, the power conversion device further comprises a first rectifying diode with an anode thereof electrically connected to the first terminal and the second electrical switch, a cathode of the first rectifying diode is electrically connected to the high-voltage terminal, and the first rectifying diode blocks a surge signal transmitted from the high-voltage terminal to the primary side.

In an embodiment of the present invention, the power conversion device further comprises a second rectifying diode with an anode thereof electrically connected to the second terminal and the first electrical switch, a cathode of the second rectifying diode is electrically connected to the low-voltage terminal, and the second rectifying diode blocks a surge signal transmitted from the low-voltage terminal to the primary side.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 2:
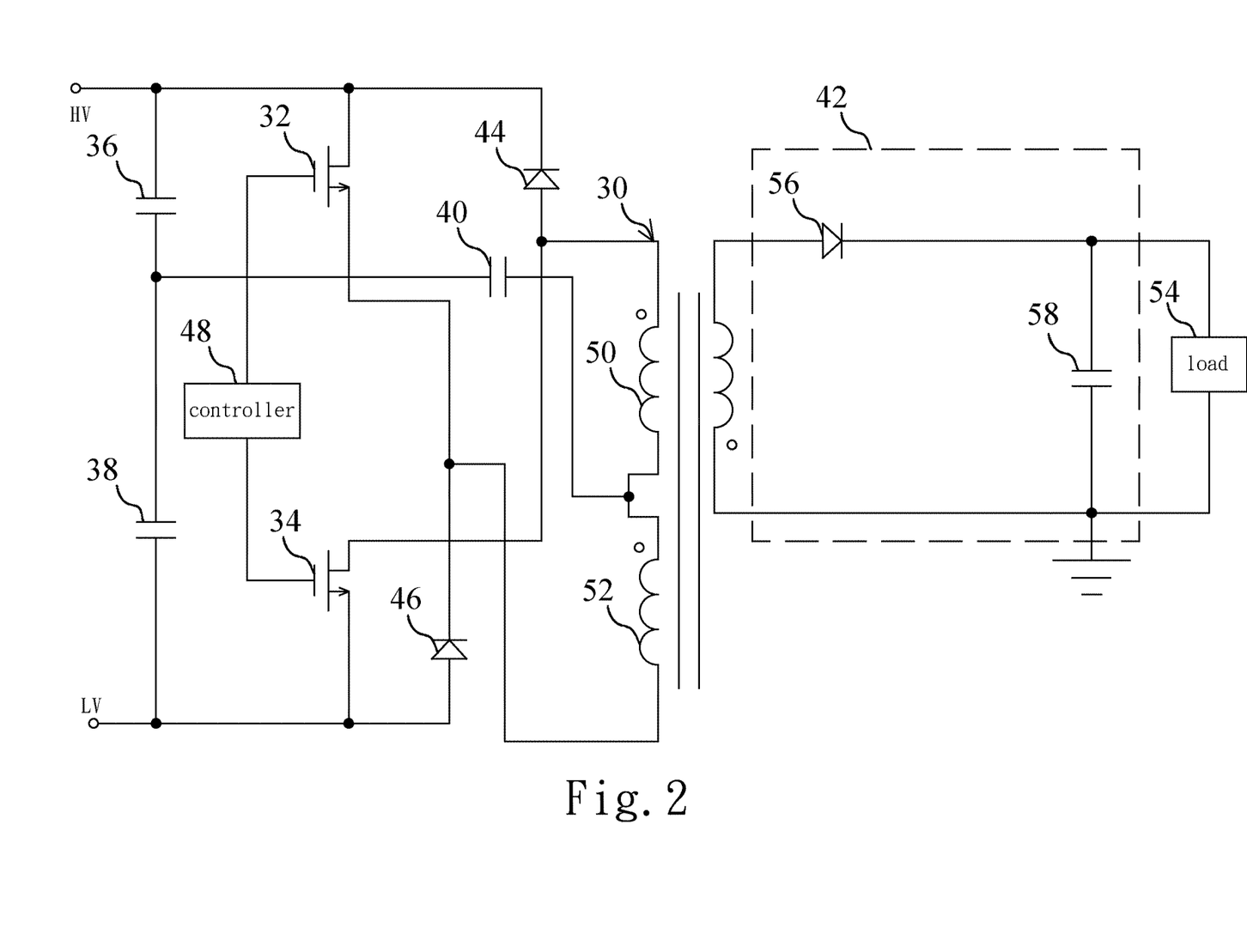
FIG. 2 is a diagram schematically illustrating a power conversion device according to the first embodiment of the present invention.

Refer to FIG. 2. The first embodiment of the power conversion device of the present invention is introduced as follows. The power conversion device comprises a transformer 30, a first electrical switch 32, a second electrical switch 34, at least one first voltage-stabilizing capacitor 36, at least one second voltage-stabilizing capacitor 38, a balanced capacitor 40, a power-providing circuit 42, a first rectifying diode 44, a second rectifying diode 46, and a controller 48, wherein the first electrical switch and the second electrical switch 34 are exemplified by metal-oxide-semiconductor field effect transistors (MOSFET), but the present invention is not limited thereto. For example, the number of the first voltage-stabilizing capacitor 36 is one and the number of the second voltage-stabilizing capacitor 38 is one. The transformer 30 has a primary side and a secondary side. The primary side has a first winding 50, a second winding 52, a first terminal, a second terminal, and a third terminal, the third terminal is located between the first terminal and the second terminal, the first winding 50 is located between the first terminal and the third terminal, and the second winding 52 is located between the second terminal and the third terminal. The first electrical switch 32 is electrically connected between a high-voltage terminal HV and the second terminal of the primary side. The second electrical switch 34 is electrically connected between a low-voltage terminal LV and the first terminal of the primary side. The first voltage-stabilizing capacitor 36 and the second voltage-stabilizing capacitor 38 are electrically connected in series, connected between the high-voltage terminal HV and the low-voltage terminal LV, and used to stabilize the voltage across the high-voltage terminal HV and the low-voltage terminal LV. An end of the balanced capacitor 40 is electrically connected between the first voltage-stabilizing capacitor 36 and the second voltage-stabilizing capacitor 38, and another end of the balanced capacitor 40 is electrically connected to the third terminal of the primary side. The power-providing circuit 42 is electrically connected to the secondary side and a load 54. The controller 48, electrically connected to the first electrical switch 32 and the second electrical switch 34, controls the switching states of the first electrical switch 32 and the second electrical switch 34.

A direct-current (DC) voltage stores energy into the first winding 50 and the second winding 52 through the first electrical switch 32 and the second electrical switch 34 when the DC voltage is applied across the high-voltage terminal HV and the low-voltage terminal LV and the controller 48 turns on the first electrical switch 32 and the second electrical switch 34. The transformer 30 uses the energy to provide an output voltage for the load 54 through the power-providing circuit 42 when the DC voltage is applied across the high-voltage terminal HV and the low-voltage terminal LV and the controller 48 turns off the first electrical switch 32 and the second electrical switch 34. In order to make the voltage drop across the first electrical switch 32 equal to the voltage drop across the second electrical switch 34 when the first electrical switch 32 and the second electrical switch 34 are turned off, the following relationships have to be satisfied. A first total voltage drop VT1 across the secondary winding 52 and the first electrical switch 32 is equal to a second total voltage drop VT2 across the balanced capacitor 40 and the first voltage-stabilizing capacitor 36. A third total voltage drop VT3 across the first winding 50 and the second electrical switch 34 is equal to a fourth total voltage drop VT4 across the balanced capacitor 40 and the second voltage-stabilizing capacitor 38. The sum of the first total voltage drop VT1 and the fourth total voltage drop VT4 is equal to the sum of the second total voltage drop VT2 and the third total voltage drop VT3, and the sum of the second total voltage drop VT2 and the third total voltage drop VT3 is equal to the DC voltage. When these relationships are satisfied, voltage drops across the first voltage-stabilizing capacitor 36, the second voltage-stabilizing capacitor 38, the first winding 50, and the second winding 52 balance each other to balance voltage drops across the first electrical switch 32 and the second electrical switch 34. Besides, a voltage drop across the first voltage-stabilizing capacitor 36 is directly proportional to a voltage drop across the second winding 52 and a voltage drop across the second voltage-stabilizing capacitor 38 is directly proportional to a voltage drop across the first winding 50 since the abovementioned relationships are satisfied. A voltage drop across the first voltage-stabilizing capacitor 36 is inversely proportional to a voltage drop across the first winding 50 and a voltage drop across the second voltage-stabilizing capacitor 38 is inversely proportional to a voltage drop across the second winding 52. When the voltage drop across the first winding 50 is equal to the voltage drop across the second winding 52, the voltage drop across the first voltage-stabilizing capacitor 36 is equal to the voltage drop across the second voltage-stabilizing capacitor 38. Thus, when the number of coils of the first winding 50 is equal to the number of coils of the second winding 52, the capacitance of the first voltage-stabilizing capacitor 36 is equal to the capacitance of the second voltage-stabilizing capacitor 38.

For example, the DC voltage is 600 V. In order to satisfy the abovementioned relationships, each of the voltage drop across the first electrical switch 32 and the voltage drop across the second electrical switch 34 is equal to 150 V, the voltage drop across the second winding 52 is 250 V, the voltage drop across the second voltage-stabilizing capacitor 38 is 150 V, the voltage drop across the balanced capacitor 40 is 50 V, the voltage drop across the first voltage-stabilizing capacitor 36 is 350 V, and the voltage drop across the first winding 50 is 50 V. When each of the voltage drop across the first winding 50 and the voltage drop across the second winding 52 is equal to 150 V, each of the voltage drop across the first voltage-stabilizing capacitor 36 and the voltage drop across the second voltage-stabilizing capacitor 38 is equal to 300 V, such that each of the voltage drop across the first electrical switch 32 and the voltage drop across the second electrical switch 34 is equal to 150 V. In other words, the present invention designs the first voltage-stabilizing capacitor 36, the second voltage-stabilizing capacitor 38, and the balanced capacitor 40 to have suitable voltage drops and suitable capacitances and cooperates with the suitable number of coils of the first winding 50 and the second winding 52 and voltage drops of the first winding 50 and the second winding 52, thereby balancing the voltage drops across the first electrical switch 32 and the second electrical switch 34, increasing the stability of the power conversion device and the flexibility of component selection without modifying the internal structures of the first electrical switch 32 and the second electrical switch 34.

In addition, in order to stabilize the power conversion device, the anode of the first rectifying diode 44 is electrically connected to the first terminal of the primary side and the second electrical switch 34, the cathode of the first rectifying diode 44 is electrically connected to the high-voltage terminal HV, and the first rectifying diode 44 blocks a surge signal transmitted from the high-voltage terminal HV to the primary side. Similarly, the anode of the second rectifying diode 46 is electrically connected to the second terminal of the primary side and the first electrical switch 32, the cathode of the second rectifying diode 46 is electrically connected to the low-voltage terminal LV, and the second rectifying diode 46 blocks a surge signal transmitted from the low-voltage terminal LV to the primary side. The first embodiment of the power conversion device is exemplified by a Flyback conversion device. Thus, the secondary side has a fourth terminal and a fifth terminal. The power-providing circuit 42 further comprises a first diode 56 and a power-providing capacitor 58. The anode of the first diode 56 is electrically connected to the fourth terminal of the secondary side, and the cathode of the first diode 56 is electrically connected to the load 54. A terminal of the power-providing capacitor 58 is electrically connected to the load 54 and the cathode of the first diode 56, another terminal of the power-providing capacitor 58 is electrically connected to the load 54, a grounding terminal, and the fifth terminal of the secondary side, and the transformer 30 uses the energy to provide the output voltage for the load 54 through the first diode 56 and the power-providing capacitor 58.

Figure 3:
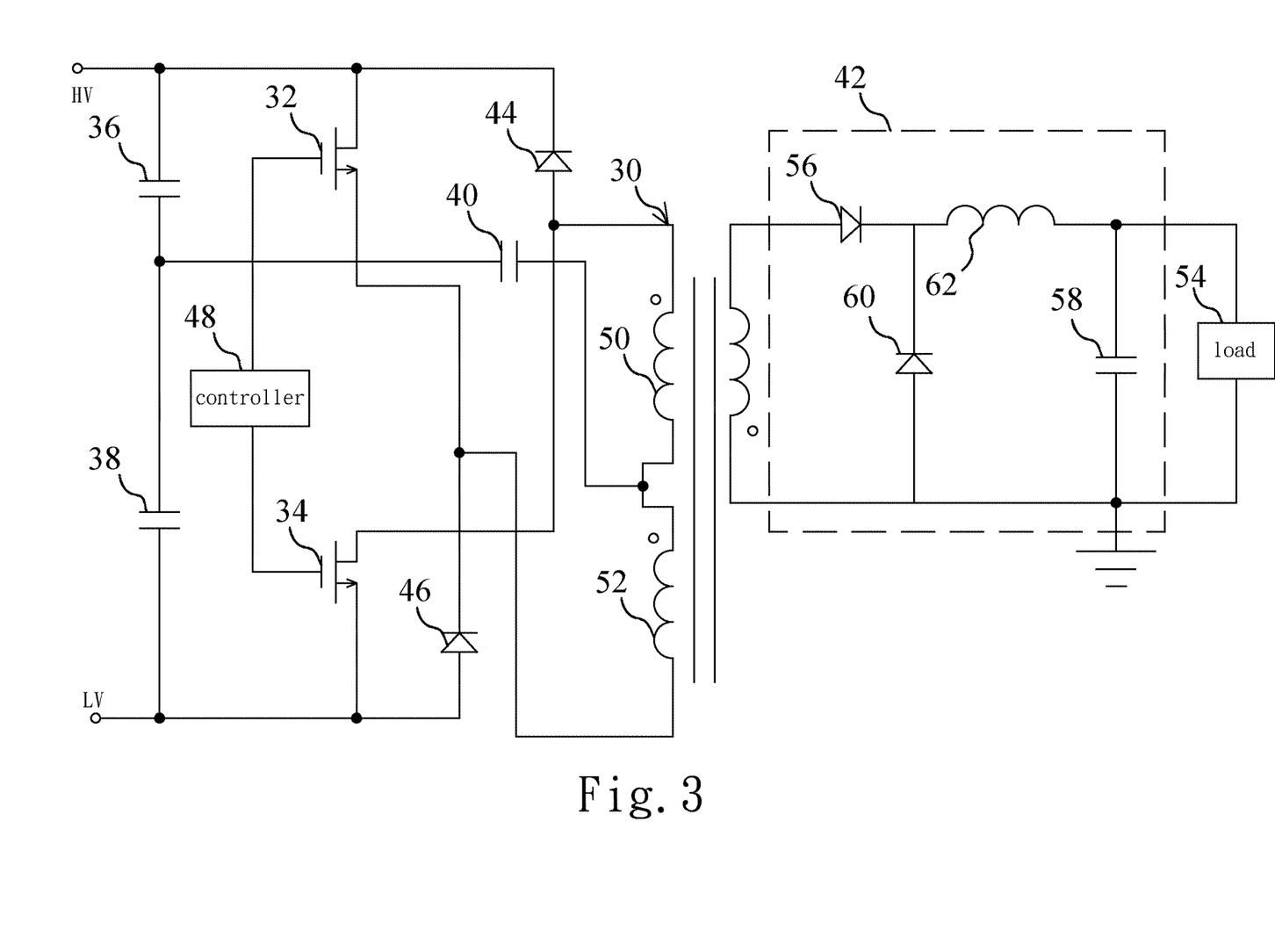
FIG. 3 is a diagram schematically illustrating a power conversion device according to the second embodiment of the present invention.

Refer to FIG. 3. The second embodiment of the power conversion device of the present invention is introduced as follows. The second embodiment of the power conversion device is exemplified by a Forward conversion device. Compared with the first embodiment, the power-providing circuit 42 further comprises a second diode 60 and an inductor 62. The anode of the second diode 60 is electrically connected to the grounding terminal and the fifth terminal of the secondary side, and the cathode of the second diode 60 is electrically connected to the cathode of the first diode 56. A terminal of the inductor 62 is electrically connected to the cathodes of the first diode 56 and the second diode 60, another terminal of the inductor 62 is electrically connected to the power-providing capacitor 58 and the load 54, and the transformer 30 uses the energy to provide the output voltage for the load 54 through the first diode 56, the second diode 60, the inductor 62, and the power-providing capacitor 58. The operation of the primary side is the same to that of the first embodiment so will not reiterated. Thus, the second embodiment and the first embodiment can achieve the same purpose.

Figure 4:
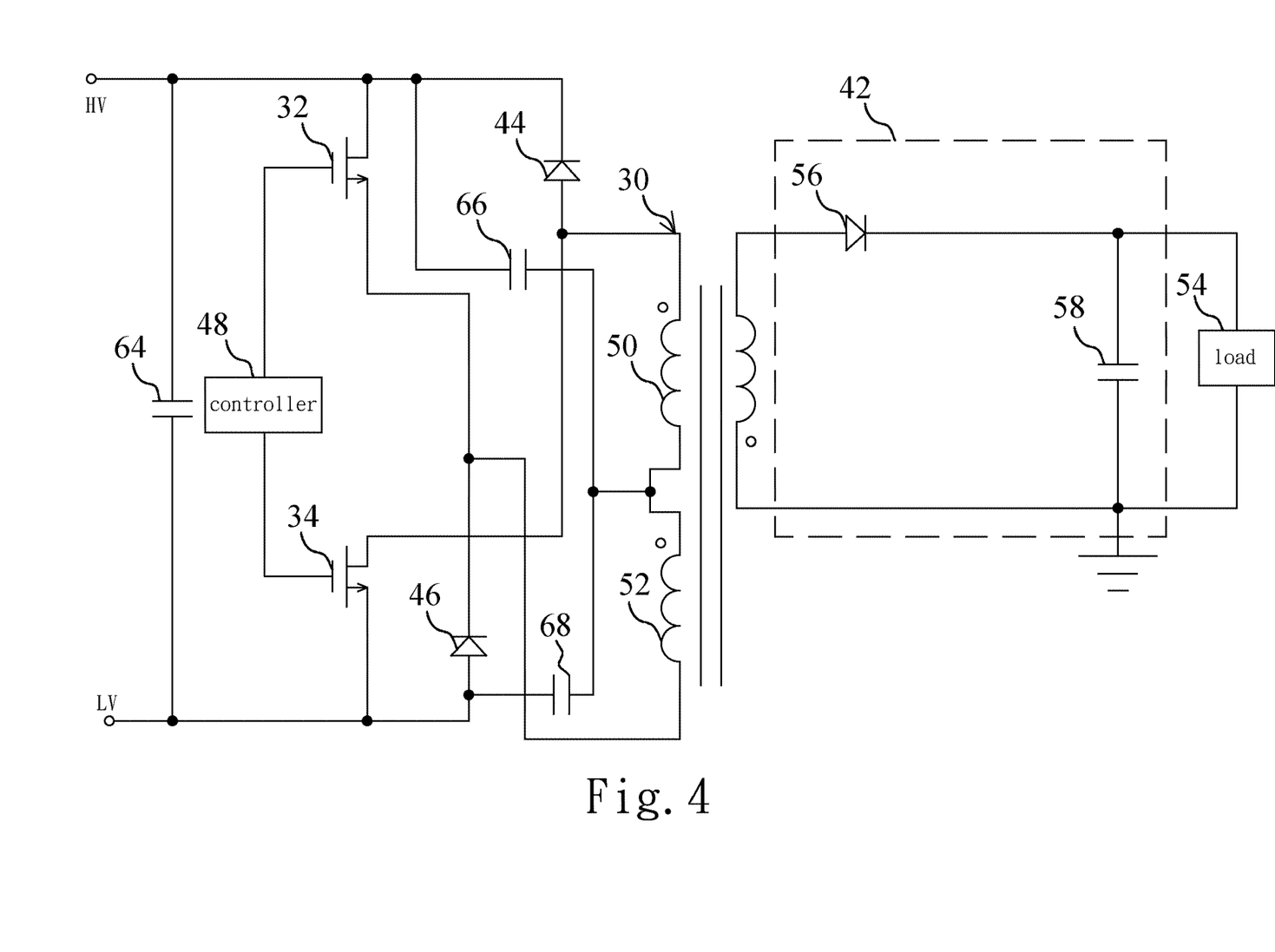
FIG. 4 is a diagram schematically illustrating a power conversion device according to the third embodiment of the present invention.

Refer to FIG. 4. The third embodiment of the power conversion device of the present invention is introduced as follows. The power conversion device comprises a transformer 30, a first electrical switch 32, a second electrical switch 34, at least one voltage-stabilizing capacitor 64, a first balanced capacitor 66, a second balanced capacitor 68, a power-providing circuit 42, a first rectifying diode 44, a second rectifying diode 46, and a controller 48, wherein the first electrical switch 32 and the second electrical switch 34 are exemplified by metal-oxide-semiconductor field effect transistors (MOSFET), but the present invention is not limited thereto. For example, the number of the voltage-stabilizing capacitor 64 is one. The transformer 30 has a primary side and a secondary side. The primary side has a first winding 50, a second winding 52, a first terminal, a second terminal, and a third terminal, the third terminal is located between the first terminal and the second terminal, the first winding 50 is located between the first terminal and the third terminal, and the second winding 52 is located between the second terminal and the third terminal. The first electrical switch 32 is electrically connected between a high-voltage terminal HV and the second terminal of the primary side. The second electrical switch 34 is electrically connected between a low-voltage terminal LV and the first terminal of the primary side. The voltage-stabilizing capacitor 64 is electrically connected between the high-voltage terminal HV and the low-voltage terminal LV and used to stabilize the voltage across the high-voltage terminal HV and the low-voltage terminal LV. The first balanced capacitor 66 is electrically connected between the third terminal of the primary side and the high-voltage terminal HV, and the second balanced capacitor 68 is electrically connected between the third terminal of the primary side and the low-voltage terminal LV. The power-providing circuit 42 is electrically connected to the secondary side and a load 54. The controller 48, electrically connected to the first electrical switch 32 and the second electrical switch 34, controls the switching states of the first electrical switch 32 and the second electrical switch 34.

A direct-current (DC) voltage stores energy into the first winding 50 and the second winding 52 through the first electrical switch 32 and the second electrical switch 34 when the DC voltage is applied across the high-voltage terminal HV and the low-voltage terminal LV and the controller 48 turns on the first electrical switch 32 and the second electrical switch 34. The transformer 30 uses the energy to provide an output voltage for the load 54 through the power-providing circuit 42 when the DC voltage is applied across the high-voltage terminal HV and the low-voltage terminal LV and the controller 48 turns off the first electrical switch 32 and the second electrical switch 34. In order to make the voltage drop across the first electrical switch 32 equal to the voltage drop across the second electrical switch 34 when the first electrical switch 32 and the second electrical switch 34 are turned off, the following relationships have to be satisfied. A first total voltage drop VT1 across the secondary winding 52 and the first electrical switch 32 is equal to a voltage drop VC1 across the first balanced capacitor 66, a second total voltage drop VT2 across the first winding 50 and the second electrical switch 34 is equal to a voltage drop VC2 across the second balanced capacitor 66, a third total voltage drop VT3 across the second winding 52, the second balanced capacitor 68, and the first electrical switch 32 is equal to a fourth total voltage drop VT4 across the first winding 50, the first balanced capacitor 66, and the second electrical switch 34, and the fourth total voltage drop VT4 is equal to a fifth total voltage drop VT5 across the first balanced capacitor 66 and the second balanced capacitor 68. When these relationships are satisfied, voltage drops across the first balanced capacitor 36, the second balanced capacitor 38, the first winding 50, and the second winding 52 balance each other to balance voltage drops across the first electrical switch 32 and the second electrical switch 34. Besides, since the abovementioned relationships are satisfied, the voltage drop VC1 across the first balanced capacitor 66 is directly proportional to a voltage drop across the second winding 52, the voltage drop VC2 across the second balanced capacitor 68 is directly proportional to a voltage drop across the first winding 50, the voltage drop VC1 across the first balanced capacitor 66 is inversely proportional to the voltage drop across the first winding 50, and the voltage drop VC2 across the second balanced capacitor 68 is inversely proportional to the voltage drop across the second winding 52. When the voltage drop across the first winding 50 is equal to the voltage drop across the second winding 52, the voltage drop VC1 across the first balanced capacitor 66 is equal to the voltage drop VC2 across the second balanced capacitor 68. Thus, when the number of coils of the first winding 50 is equal to the number of coils of the second winding 52, the capacitance of the first balanced capacitor 66 is equal to the capacitance of the second balanced capacitor 68.

For example, the DC voltage is 600 V. In order to satisfy the abovementioned relationships, each of the voltage drop across the first electrical switch 32 and the voltage drop across the second electrical switch 34 is equal to 150 V, the voltage drop across the second winding 52 is 200 V, the voltage drop VC2 across the second balanced capacitor 68 is 250 V, the voltage drop VC1 across the first balanced capacitor 66 is 350 V, and the voltage drop across the first winding 50 is 100 V. Alternatively, each of the voltage drop across the first electrical switch 32 and the voltage drop across the second electrical switch 34 is equal to 150 V, the voltage drop across the second winding 52 is 100 V, the voltage drop VC2 across the second balanced capacitor 68 is 350 V, the voltage drop VC1 across the first balanced capacitor 66 is 250 V, and the voltage drop across the first winding 50 is 200 V. When each of the voltage drop across the first winding 50 and the voltage drop across the second winding 52 is equal to 150 V, each of the voltage drop across the first balanced capacitor 66 and the voltage drop across the second balanced capacitor 68 is equal to 300 V, such that each of the voltage drop across the first electrical switch 32 and the voltage drop across the second electrical switch 34 is equal to 150 V. In other words, the present invention designs the first balanced capacitor 66 and the second balanced capacitor 68 to have suitable voltage drops and suitable capacitances and cooperates with the suitable number of coils of the first winding 50 and the second winding 52 and voltage drops of the first winding 50 and the second winding 52, thereby balancing the voltage drops across the first electrical switch 32 and the second electrical switch 34, increasing the stability of the power conversion device and the flexibility of component selection without modifying the internal structures of the first electrical switch 32 and the second electrical switch 34.

In addition, in order to stabilize the power conversion device, the anode of the first rectifying diode 44 is electrically connected to the first terminal of the primary side and the second electrical switch 34, the cathode of the first rectifying diode 44 is electrically connected to the high-voltage terminal HV, and the first rectifying diode 44 blocks a surge signal transmitted from the high-voltage terminal HV to the primary side. Similarly, the anode of the second rectifying diode 46 is electrically connected to the second terminal of the primary side and the first electrical switch 32, the cathode of the second rectifying diode 46 is electrically connected to the low-voltage terminal LV, and the second rectifying diode 46 blocks a surge signal transmitted from the low-voltage terminal LV to the primary side. The third embodiment of the power conversion device is exemplified by a Flyback conversion device. Thus, the secondary side has a fourth terminal and a fifth terminal. The power-providing circuit 42 further comprises a first diode 56 and a power-providing capacitor 58. The anode of the first diode 56 is electrically connected to the fourth terminal of the secondary side, and the cathode of the first diode 56 is electrically connected to the load 54. A terminal of the power-providing capacitor 58 is electrically connected to the load 54 and the cathode of the first diode 56, another terminal of the power-providing capacitor 58 is electrically connected to the load 54, a grounding terminal, and the fifth terminal of the secondary side, and the transformer 30 uses the energy to provide the output voltage for the load 54 through the first diode 56 and the power-providing capacitor 58.

Figure 5:
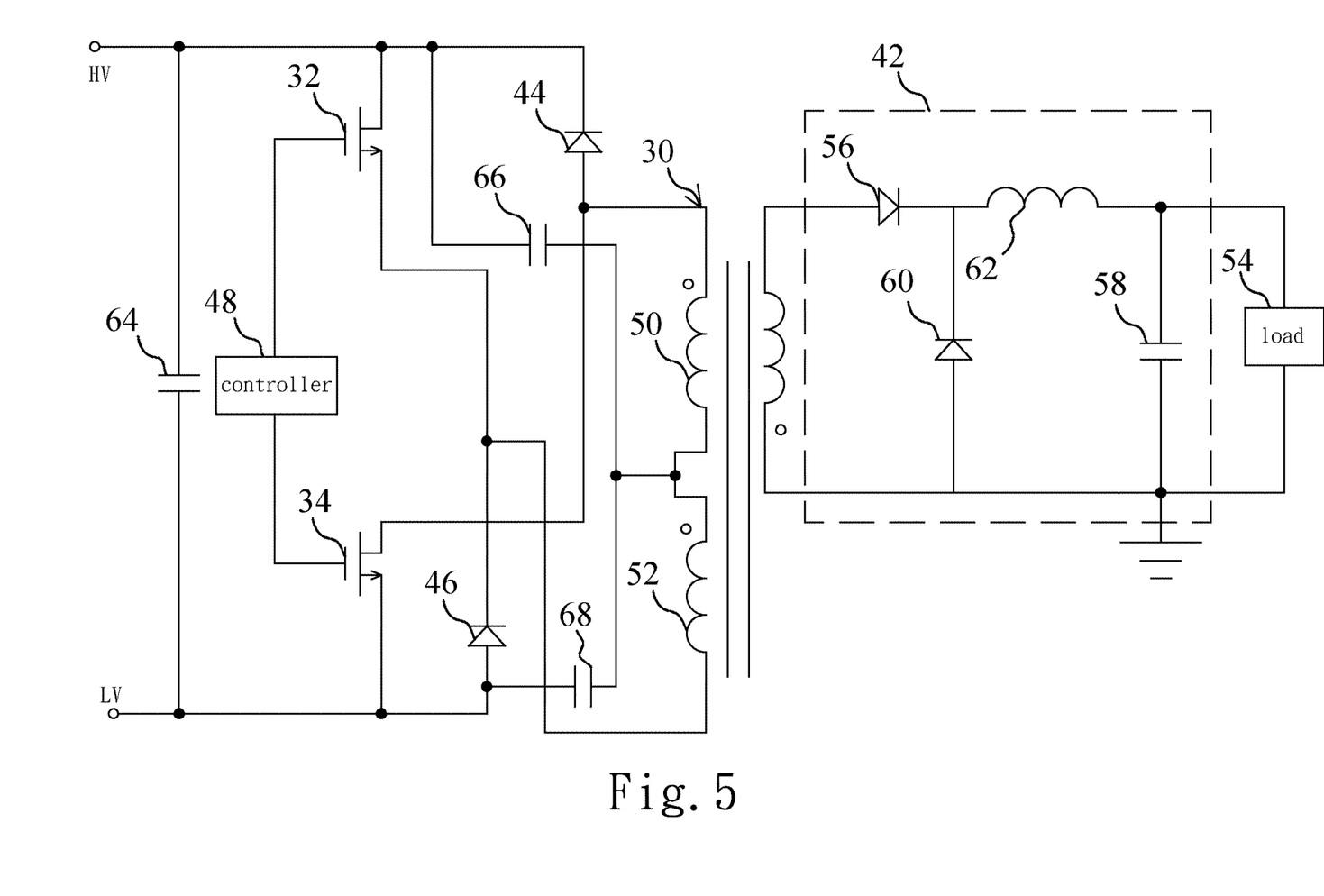
FIG. 5 is a diagram schematically illustrating a power conversion device according to the fifth embodiment of the present invention.

Refer to FIG. 5. The fourth embodiment of the power conversion device of the present invention is introduced as follows. The fourth embodiment of the power conversion device is exemplified by a Forward conversion device. Compared with the third embodiment, the power-providing circuit 42 further comprises a second diode 60 and an inductor 62. The anode of the second diode 60 is electrically connected to the grounding terminal and the fifth terminal of the secondary side, and the cathode of the second diode 60 is electrically connected to the cathode of the first diode 56. A terminal of the inductor 62 is electrically connected to the cathodes of the first diode 56 and the second diode 60, another terminal of the inductor 62 is electrically connected to the power-providing capacitor 58 and the load 54, and the transformer 30 uses the energy to provide the output voltage for the load 54 through the first diode 56, the second diode 60, the inductor 62, and the power-providing capacitor 58. The operation of the primary side is the same to that of the third embodiment so will not reiterated. Thus, the fourth embodiment and the third embodiment can achieve the same purpose.

In conclusion, the present invention designs a balanced capacitor and the primary side of a transformer to have suitable voltage drops, such that the voltage drops across a first electrical switch and a second electrical switch balance each other without changing the internal structures of the first electrical switch and the second electrical switch, thereby improving the stability of the power conversion device and the flexibility of component selection.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A power conversion device comprising:
   a transformer having a primary side and a secondary side, the primary side has a first winding, a second winding, a first terminal, a second terminal, and a third terminal, the third terminal is located between the first terminal and the second terminal, the first winding is located between the first terminal and the third terminal, the second winding is located between the second terminal and the third terminal, and the first winding and the second winding store energy;
   a first electrical switch electrically connected between a high-voltage terminal and the second terminal;
   a second electrical switch electrically connected between a low-voltage terminal and the first terminal;
   at least one first voltage-stabilizing capacitor and at least one second voltage-stabilizing capacitor electrically connected in series and connected between the high-voltage terminal and the low-voltage terminal;
   a balanced capacitor with an end thereof electrically connected between the at least one first voltage-stabilizing capacitor and the at least one second voltage-stabilizing capacitor, and another end of the balanced capacitor is electrically connected to the third terminal; and
   a power-providing circuit electrically connected to the secondary side and a load, a direct-current (DC) voltage is applied across the high-voltage terminal and the low-voltage terminal, when the first electrical switch and the second electrical switch are turned off, the transformer uses the energy to provide an output voltage for the load through the power-providing circuit, a first total voltage drop across the secondary winding and the first electrical switch is equal to a second total voltage drop across the balanced capacitor and the at least one first voltage-stabilizing capacitor, and a third total voltage drop across the first winding and the second electrical switch is equal to a fourth total voltage drop across the balanced capacitor and the at least one second voltage-stabilizing capacitor, a sum of the first total voltage drop and the fourth total voltage drop is equal to a sum of the second total voltage drop and the third total voltage drop, a sum of the second total voltage drop and the third total voltage drop is equal to the DC voltage, and voltage drops across the at least one first voltage-stabilizing capacitor, the at least one second voltage-stabilizing capacitor, the first winding, and the second winding balance each other to balance voltage drops across the first electrical switch and the second electrical switch.

2. The power conversion device according to claim 1, wherein a voltage drop across the at least one first voltage-stabilizing capacitor is directly proportional to a voltage drop across the second winding and a voltage drop across the at least one second voltage-stabilizing capacitor is directly proportional to a voltage drop across the first winding.

3. The power conversion device according to claim 1, wherein number of coils of the first winding is equal to number of coils of the second winding and a capacitance of the at least one first voltage-stabilizing capacitor is equal to a capacitance of the at least one second voltage-stabilizing capacitor.

4. The power conversion device according to claim 1, wherein a voltage drop across the at least one first voltage-stabilizing capacitor is inversely proportional to a voltage drop across the first winding and a voltage drop across the at least one second voltage-stabilizing capacitor is inversely proportional to a voltage drop across the second winding.

5. The power conversion device according to claim 1, wherein the secondary side has a fourth terminal and a fifth terminal and the power-providing circuit further comprises:
   a first diode with an anode thereof electrically connected to the fourth terminal, and a cathode of the first diode is electrically connected to the load; and
   a power-providing capacitor with one terminal thereof electrically connected to the load and the cathode of the first diode, another terminal of the power-providing capacitor is electrically connected to the load, a grounding terminal, and the fifth terminal, and the transformer uses the energy to provide the output voltage for the load through the first diode and the power-providing capacitor.

6. The power conversion device according to claim 5, wherein the power-providing circuit further comprises:
   a second diode with an anode thereof electrically connected to the grounding terminal and the fifth terminal, and a cathode of the second diode is electrically connected to the cathode of the first diode; and
   an inductor with one terminal thereof electrically connected to the cathodes of the first diode and the second diode, another terminal of the inductor is electrically connected to the power-providing capacitor and the load, and the transformer uses the energy to provide the output voltage for the load through the second diode and the inductor.

7. The power conversion device according to claim 1, wherein the DC voltage stores the energy into the first winding and the second winding when the DC voltage is generated and the first electrical switch and the second electrical switch are turned on.

8. The power conversion device according to claim 1, wherein the first electrical switch and the second electrical switch are metal-oxide-semiconductor field effect transistors (MOSFET).

9. The power conversion device according to claim 1, further comprising a first rectifying diode with an anode thereof electrically connected to the first terminal and the second electrical switch, a cathode of the first rectifying diode is electrically connected to the high-voltage terminal, and the first rectifying diode blocks a surge signal transmitted from the high-voltage terminal to the primary side.

10. The power conversion device according to claim 9, further comprising a second rectifying diode with an anode thereof electrically connected to the second terminal and the first electrical switch, a cathode of the second rectifying diode is electrically connected to the low-voltage terminal, and the second rectifying diode blocks a surge signal transmitted from the low-voltage terminal to the primary side.

11. A power conversion device comprising:
a transformer having a primary side and a secondary side, the primary side has a first winding, a second winding, a first terminal, a second terminal, and a third terminal, the third terminal is located between the first terminal and the second terminal, the first winding is located between the first terminal and the third terminal, the second winding is located between the second terminal and the third terminal, and the first winding and the second winding store energy;
a first electrical switch electrically connected between a high-voltage terminal and the second terminal;
a second electrical switch electrically connected between a low-voltage terminal and the first terminal;
a first balanced capacitor electrically connected between the third terminal and the high-voltage terminal;
a second balanced capacitor electrically connected between the third terminal and the low-voltage terminal; and
a power-providing circuit electrically connected to the secondary side and a load, a direct-current (DC) voltage is applied across the high-voltage terminal and the low-voltage terminal, when the first electrical switch and the second electrical switch are turned off, the transformer uses the energy to provide an output voltage for the load through the power-providing circuit, a first total voltage drop across the secondary winding and the first electrical switch is equal to a voltage drop across the first balanced capacitor, a second total voltage drop across the first winding and the second electrical switch is equal to a voltage drop across the second balanced capacitor, a third total voltage drop across the second winding, the second balanced capacitor, and the first electrical switch is equal to a fourth total voltage drop across the first winding, the first balanced capacitor, and the second electrical switch, the fourth total voltage drop is equal to a fifth total voltage drop across the first balanced capacitor and the second balanced capacitor, and voltage drops across the first balanced capacitor, the second balanced capacitor, the first winding, and the second winding balance each other to balance voltage drops across the first electrical switch and the second electrical switch.

12. The power conversion device according to claim 11, further comprising at least one voltage-stabilizing capacitor electrically connected between the high-voltage terminal and the low-voltage terminal.

13. The power conversion device according to claim 11, wherein a voltage drop across the first balanced capacitor is directly proportional to a voltage drop across the second winding and a voltage drop across the second balanced capacitor is directly proportional to a voltage drop across the first winding.

14. The power conversion device according to claim 11, wherein number of coils of the first winding is equal to number of coils of the second winding and a capacitance of the first balanced capacitor is equal to a capacitance of the second balanced capacitor.

15. The power conversion device according to claim 11, wherein a voltage drop across the first balanced capacitor is inversely proportional to a voltage drop across the first winding and a voltage drop across the second balanced capacitor is inversely proportional to a voltage drop across the second winding.

16. The power conversion device according to claim 11, wherein the secondary side has a fourth terminal and a fifth terminal and the power-providing circuit further comprises:
a first diode with an anode thereof electrically connected to the fourth terminal, and a cathode of the first diode is electrically connected to the load; and
a power-providing capacitor with one terminal thereof electrically connected to the load and the cathode of the first diode, another terminal of the power-providing capacitor is electrically connected to the load, a grounding terminal, and the fifth terminal, and the transformer uses the energy to provide the output voltage for the load through the first diode and the power-providing capacitor.

17. The power conversion device according to claim 16, wherein the power-providing circuit further comprises:
a second diode with an anode thereof electrically connected to the grounding terminal and the fifth terminal, and a cathode of the second diode is electrically connected to the cathode of the first diode; and
an inductor with one terminal thereof electrically connected to the cathodes of the first diode and the second diode, another terminal of the inductor is electrically connected to the power-providing capacitor and the load, and the transformer uses the energy to provide the output voltage for the load through the second diode and the inductor.

18. The power conversion device according to claim 11, wherein the DC voltage stores the energy into the first winding and the second winding when the DC voltage is generated and the first electrical switch and the second electrical switch are turned on.

19. The power conversion device according to claim 11, wherein the first electrical switch and the second electrical switch are metal-oxide-semiconductor field effect transistors (MOSFET).

20. The power conversion device according to claim 11, further comprising a first rectifying diode with an anode thereof electrically connected to the first terminal and the second electrical switch, a cathode of the first rectifying diode is electrically connected to the high-voltage terminal, and the first rectifying diode blocks a surge signal transmitted from the high-voltage terminal to the primary side.

21. The power conversion device according to claim 20, further comprising a second rectifying diode with an anode thereof electrically connected to the second terminal and the first electrical switch, a cathode of the second rectifying diode is electrically connected to the low-voltage terminal, and the second rectifying diode blocks a surge signal transmitted from the low-voltage terminal to the primary side.

* * * * *